(12) United States Patent
Ohashi (10) Patent No.: US 11,778,399 B2
(45) Date of Patent: Oct. 3, 2023

(54) HEADPHONE VOLUME CONTROL METHOD AND HEADPHONE

(71) Applicant: YAMAHA CORPORATION, Hamamatsu (JP)

(72) Inventor: Noriyuki Ohashi, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 0 days.

(21) Appl. No.: 17/564,463

(22) Filed: Dec. 29, 2021

(65) Prior Publication Data

US 2022/0124445 A1   Apr. 21, 2022

Related U.S. Application Data

(63) Continuation of application No. 17/108,410, filed on Dec. 1, 2020, now Pat. No. 11,245,997.

(30) Foreign Application Priority Data

Dec. 25, 2019   (JP) .................. 2019-234523

(51) Int. Cl.
  *G06F 3/16*   (2006.01)
  *H04R 29/00*   (2006.01)
  *H04R 3/00*   (2006.01)

(52) U.S. Cl.
  CPC ........... *H04R 29/001* (2013.01); *G06F 3/165* (2013.01); *H04R 3/00* (2013.01); *H04R 2430/01* (2013.01)

(58) Field of Classification Search
  CPC .... H04R 29/001; H04R 3/00; H04R 2430/01; G06F 3/165
  See application file for complete search history.

(56) References Cited

U.S. PATENT DOCUMENTS

| | | | |
|---|---|---|---|
| 7,983,426 | B2 | 7/2011 | Schuler |
| 9,059,670 | B2 | 6/2015 | Yamkovoy |
| 9,609,449 | B1 | 3/2017 | Mäenpää |
| 2003/0191609 | A1 | 10/2003 | Bernardi |
| 2006/0262938 | A1 | 11/2006 | Gauger, Jr. |
| 2008/0159547 | A1 | 7/2008 | Schuler |
| 2009/0290721 | A1 | 11/2009 | Goldstein |
| 2011/0095875 | A1 | 4/2011 | Thyssen |
| 2013/0101126 | A1 | 4/2013 | Van De Par |
| 2013/0259247 | A1 | 10/2013 | Kim |
| 2014/0086427 | A1 | 3/2014 | Yamkovoy |

(Continued)

FOREIGN PATENT DOCUMENTS

| | | |
|---|---|---|
| CN | 102726060 A | 10/2012 |
| CN | 104662796 A | 5/2015 |

(Continued)

OTHER PUBLICATIONS

Extended European search report issued in European Appln. No. 20211494.8 dated May 25, 2021.

(Continued)

*Primary Examiner* — Joseph Saunders, Jr.
(74) *Attorney, Agent, or Firm* — ROSSI, KIMMS & McDOWELL LLP (57) ABSTRACT

A headphone volume control method calculates a level of a sound signal, which is captured by a microphone, during a first period, determines a target value of a sound volume based on the above-mentioned level, and gradually changes a reproduction volume of content to be reproduced to the above-mentioned target value over a second period.

14 Claims, 4 Drawing Sheets

(56) References Cited

U.S. PATENT DOCUMENTS

2016/0087597 A1   3/2016  Barker
2020/0184944 A1   6/2020  Dahl
2021/0144463 A1   5/2021  Gong

FOREIGN PATENT DOCUMENTS

| EP | 2487930 A1 | 8/2012 |
| EP | 3383063 A1 | 10/2018 |
| EP | 3461146 A1 | 3/2019 |
| JP | 2013519285 A | 5/2013 |
| KR | 1020050076959 A | 7/2005 |
| WO | 2011095912 A1 | 8/2011 |
| WO | 2019015910 A1 | 1/2019 |
| WO | 2019130788 A1 | 7/2019 |

OTHER PUBLICATIONS

Office Action issued in U.S. Appl. No. 17/108,410 dated Jun. 10, 2021.
Notice of Allowance issued in U.S. Appl. No. 17/108,410 dated Oct. 8, 2021.
Office Action issued in Chinese Application No. 202011335326.1 dated Feb. 16, 2022. English translation provided.
Office Action issued in Chinese Appln. No. 202011335326.1 dated Sep. 1, 2022. English translation provided.
Office Action issued in European Appln. No. 20211494.8 dated Jun. 6, 2023.
Office Action issued in Japanese Appln. No. 2019-234523, dated Jul. 28, 2023. English machine translation provided.

FIG.4 ated application claims priority under 35
HEADPHONE VOLUME CONTROL METHOD AND HEADPHONE

CROSS REFERENCE TO RELATED APPLICATIONS

This Nonprovisional application claims priority under 35 U.S.C. § 119(a) on Patent Application No. 2019-234523 filed in Japan on Dec. 25, 2019 the entire contents of which are hereby incorporated by reference.

BACKGROUND

1. Technical Field

One embodiment of the present disclosure relates to a headphone volume control method that controls a volume of a headphone, and a headphone.

2. Background Information

U.S. Pat. Nos. 9,609,449 and 7,983,426 disclose a method for controlling a sound volume such that a total level of an environmental sound captured by a microphone and an output sound does not exceed a threshold.

SUMMARY

When using a headphone, a user may increase a sound volume of content depending on a volume of ambient environmental sounds. After that, even if the surroundings become quiet, a user may continue to hear the content at a large volume, because the user gets used to a loud sound or feels troublesome in a volume operation. The continuous hearing at a large volume is not desirable from the viewpoint of hearing protection. However, if a sound volume of content is changed depending on a volume of environmental sounds like U.S. Pat. Nos. 9,609,449 and 7,983,426, a user may notice the volume change and feel sense of incongruity.

An object of one embodiment of the present disclosure is to provide a headphone volume control method capable of changing a sound volume without causing a user to notice the volume change, and a headphone.

The headphone volume control method calculates a level of a sound signal, which is captured by a microphone, during a first period, determines a target value of a sound volume based on the above-mentioned level, and gradually changes a reproduction volume of content to be reproduced to the above-mentioned target value over a second period.

According to one embodiment of the present disclosure, a sound volume can be changed without causing a user noticing the volume change.

DETAILED DESCRIPTION

Figure 1:
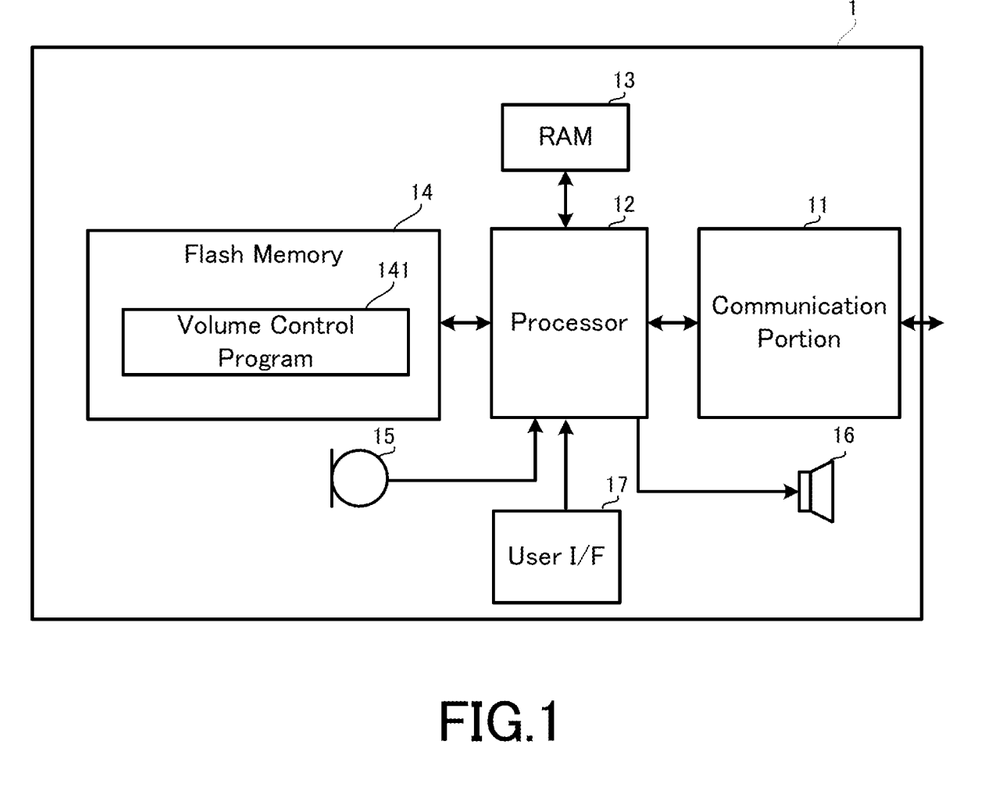
FIG. 1 is a block diagram showing a configuration of a headphone 1.

FIG. 1 is a block diagram showing a configuration of a headphone 1. The headphone 1 includes a communication portion 11, a processor 12, a RAM 13, a flash memory 14, a microphone 15, a speaker unit 16, and a user I/F 17.

The communication portion 11 receives a sound signal from an information processing terminal such as a smartphone, or a player such as portable music playback equipment through wireless communications such as Bluetooth (registered trademark). The present disclosure, however, is not limited to a headphone for wireless communications. The communication portion 11 may receive a sound signal from a player through a communication cable or an audio cable. Further, the headphone is not limited to an in-ear type of headphone that is inserted into an external auditory canal for use. The headphone may include an overhead type of headphone having a head band.

Note that, FIG. 1 shows one of two units each being inserted into a left ear or a right ear for use. The two units have the same configuration and function. However, it is not necessary for the two units to have the same configuration and function. For instance, either one of the two units, i.e., a left ear unit or a right ear unit may include the configuration shown in FIG. 1 and control a volume of the sound signal to be supplied to the other unit. In this case, the other unit receives the sound signal, which is subjected to the volume control in the one unit, and the sound signal is outputted from a speaker unit.

In FIG. 1, the processor 12 is constituted by a CPU, a DSP, an SoC (System on a Chip), or the like. The processor 12 reads out a program from the flash memory 14, serving as a storage medium, and stores it in a RAM 13 temporarily, thereby executing various kinds of operations. The program includes a volume control program 141.

The flash memory 14 stores an operation program of the processor 12. For instance, the flash memory 14 stores the above-mentioned volume control program 141. By executing the volume control program 141, the processor 12 achieves a headphone volume control method and a headphone volume controller of the present disclosure.

The microphone 15 captures an ambient sound as a sound signal. The ambient sound contains an environmental sound. Note that, the environmental sound contains sounds other than content, for example, a noise. The microphone 15 converts the captured sound signal into a digital signal. The microphone 15 outputs the sound signal, which is subjected to the digital conversion, to the processor 12.

The processor 12 receives the sound signal in accordance with the environmental sound from the microphone 15. The processor 12 receives a sound signal of content from the communication portion 11. The processor 12 controls a volume of the sound signal of content based on a volume change operation (a gain specifying operation) received from a user I/F 17 and the sound signal received from the microphone 15. The processor 12 outputs the sound signal of content to the speaker unit 16.

The speaker unit 16 converts the sound signal of content into an analog signal. Based on the analog signal, the speaker unit 16 emits sounds.

The user I/F 17 receives an operation from a user. The operation received from a user includes volume change (gain specification), for example.

Figure 2:
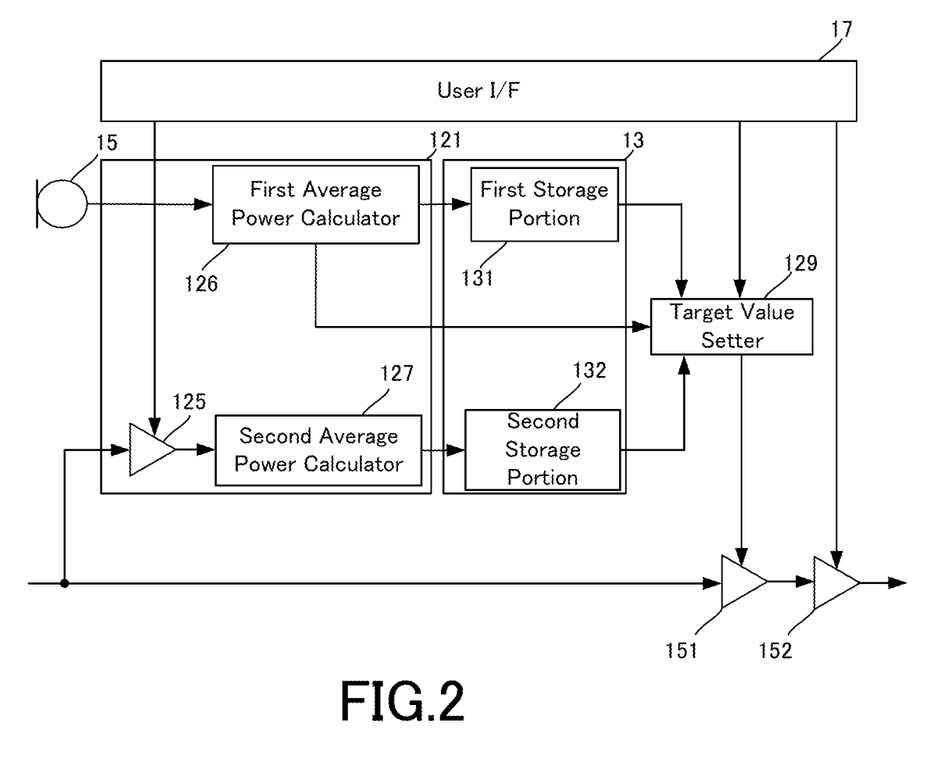
FIG. 2 is a functional block diagram of the headphone 1.
Figure 3:
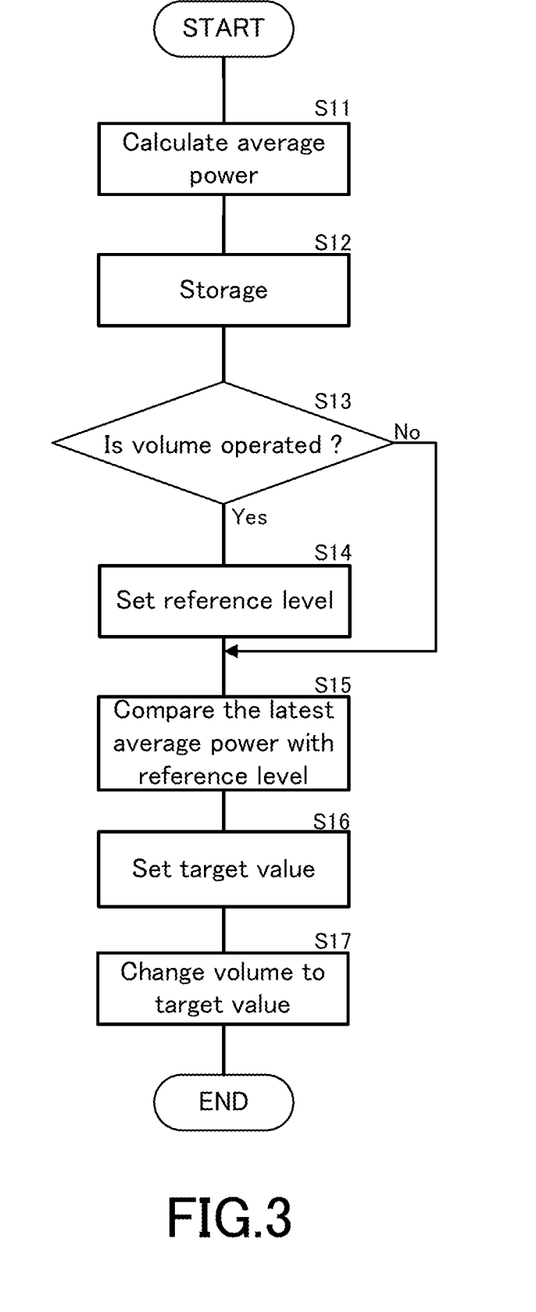
FIG. 3 is a flowchart showing an operation of a processor 12.

FIG. 2 is a block diagram showing a functional configuration of the headphone 1 including the processor 12. FIG. 3 is a flowchart showing an operation of the processor 12. The processor 12 includes a first level adjuster 125, a first average power calculator 126, a second average power calculator 127, a first storage portion 131, a second storage portion 132, a target value setter 129, a second level adjuster 151, and a third level adjuster 152. A level calculator 121 is constituted by the first level adjuster 125, the first average power calculator 126, and the second average power calculator 127. The first storage portion 131 and the second storage portion 132 each are constituted by the flash memory 14.

The level calculator 121 calculates a level of the sound signal captured by the microphone 15 during a first period. Specifically, the level calculator 121 calculates an average power of the sound signals captured by the microphone 15 during the first period (S11). Note that, the level calculated by the level calculator 121 is not limited to an average power.

The first average power calculator 126 calculates an average power during, for example, 1000 msec as the first period. For instance, in the case where a sampling frequency of the sound signal is 48 kHz, the first average power calculator 126 calculates an average power of 48000 samples containing the latest sampling data. Note that, the first average power calculator 126 may calculate an average power such that values of the samples each are squared, added to one another, and divided by the number of samples, for example. Further, in calculation of the average power, frequency characteristics of the sound signal may be corrected with an A characteristic. Thus, a power of the sound signal affecting a hearing sense can be evaluated appropriately in the processor 12.

The first average power calculator 126 outputs the calculated first average power to the first storage portion 131 and the target value setter 129. The first storage portion 131 stores the first average power received from the first average power calculator 126 (S12). The first storage portion 131 stores a plurality of first average powers. The first storage portion 131 stores first average powers that are calculated a plurality of times (e.g., four times), in which the latest first average power is contained.

When detecting a user's volume operation through the user I/F 17 (S13), the target value setter 129 sets a reference level (S14). Specifically, the target value setter 129 determines a target value based on the latest first average power, which is received from the first average power calculator 126, and first average powers at a plurality of times (e.g., four times), which are stored in the first storage portion 131.

More specifically, the target value setter 129 further calculates an average of the first average powers at a plurality of times (e.g., four times). The target value setter 129 sets the average of the first average powers at a plurality of times (e.g., four times) as a reference level. Note that, when the gain specified from the user I/F 17 is changed, the target value setter 129 sets a reference level. In other words, when the volume operation is received from a user, the target value setter 129 calculates a reference level and performs volume control using the reference level.

The target value setter 129 compares the reference level with the latest first average power (S15). For instance, the target value setter 129 subtracts the reference level from the latest first average power. The target value setter 129 sets the subtracted value as a target value (S16). If the subtracted value is a negative value, the target value will also be a negative value, and if the subtracted value is a positive value, the target value will also be a positive value. When the target value is a negative value, the target value setter 129 determines that the present situation is in a state where the ambient environmental sound is felt to be quieter than the reference level. Therefore, the target value setter 129 performs control so as to decrease the sound volume. If the target value is a positive value, the present situation is in a state where the ambient environmental sound is felt to be noisier than the reference level. Therefore, the target value setter 129 performs control so as to increase the sound volume.

However, if a difference between the past first average power and the latest first average power is set as a target value as it is, the volume change will be made large. Thus, a user is likely to feel sense of incongruity. Accordingly, the target value setter 129 may reduce the target value by multiplying the subtracted value by a predetermined change ratio (e.g., ¼ to 1/12). Further, the target value setter 129 may also round off the target value by 0.5 dB.

Furthermore, the target value setter 129 may set a lower limit or an upper limit of the target value. For instance, the target value setter 129 may set the upper limit of the target value to +3 dB, or may set the lower limit of the target value to −3 dB. Further, the target value setter 129 may set the upper limit of the target value to +1.5 dB, i.e., a value smaller than the lower limit. Thus, a rising amount of volume can be suppressed, thereby giving priority to hearing protection.

Further, the target value setter 129 may change the upper limit or the lower limit of the target value depending on a volume of the sound signal of content. For instance, through the target value setter 129, the upper limit of the target value setter 129 is made variable between 0 dB and +1.5 dB, and the lower limit of the target value is made variable between −3 dB and 0 dB.

The first level adjuster 125 adjusts a level of the sound signal of content at the same gain as that of the third level adjuster 152. The gains of the first level adjuster 125 and the third level adjuster 152 are determined depending on user's volume operation through the user I/F 17.

The second average power calculator 127 calculates a second average power of sound signals during the first period (1000 msec). Herein, the sound signals have been subjected to level adjustment in the first level adjuster 125. The second average power calculator 127 outputs the calculated second average power to the second storage portion 132. The second storage portion 132 stores the second average power that is received from the second average power calculator 127. The second storage portion 132 stores second average powers calculated at a plurality of times (e.g., four times), which contain the latest second average power.

The target value setter 129 obtains the second average powers at a plurality of times (e.g., four times) stored in the second storage portion 132 and calculates an average thereof. The target value setter 129 sets the average of the second average powers at a plurality of times (e.g., four times) as a regeneration level. The target value setter 129 subtracts the regeneration level from an upper limit (e.g., −20 dB) of volume.

If the subtracted value is a negative value, the target value setter 129 decrease the upper limit of the target value, because the regeneration level is too high. For instance, the subtracted value (value obtained by subtracting the regeneration level from the upper limit of volume, i.e., −20 dB) is added from the upper limit of the present target value.

Further, the target value setter 129 subtracts the regeneration level from a lower limit (e.g., −50 dB) of volume. If the subtracted value is a positive value, the target value setter 129 increases the lower limit of the target value, because the regeneration level is too low. For instance, the subtracted value (value obtained by subtracting the regeneration level from the lower limit of volume, i.e., −50 dB) is added from the lower limit of the present target value.

Next, the target value setter 129 gradually changes a gain of a second level adjuster 151 to the target value over a second period (S17). For instance, the target value setting part 129 updates the gain gradually at 100 msec intervals in such a manner that the gain is changed by spending 15000 msec to 20000 msec per 1 dB. For instance, if a volume difference between the gain and the target value is 1 dB, the second period will be 15000 msec. If a volume difference between the gain and the target value is 2 dB, the second period will be 30000 msec. By updating the gain gradually, the target value setter 129 can reduce an amount of volume change per one time, thereby making it difficult for a user to notice the volume change. Further, the target value setter 129 is not necessary to update the gain at 100 msec intervals. For instance, the target value setter 129 may gradually update the gain at 1 msec intervals or 10 msec intervals. Further, the target value setter 129 may update the gain sample by sample, for example. When the gain of the second level adjuster 151 reaches the target value, the target value setter 129 stops updating the gain.

Thus, the target value setter 129 gradually changes a volume of the sound signal of content. According to the above-mentioned embodiment, the following effects are achieved.

(1) The processor 12 sets a target value based on a level (e.g., a first average power during 1000 msec) of the sound signal, which is captured by the microphone 15, during a first period. In other words, the processor 12 does not change a sound volume of content frequently, depending on an ambient environmental sound. Therefore, the processor 12 does not give sense of incongruity, which is caused by volume change, to a user. Note that, if it takes too long to calculate the first average power, the sound volume will be changed too slowly. This makes it difficult to follow a change in ambient sounds. On the other hand, if it takes too short to calculate the first average power, the sound volume will be changed too frequently.

This makes it easy for a user to notice the volume change. Accordingly, the period for calculating the first average power is preferably in a range from 500 msec to 5000 msec.

(2) The processor 12 changes a gain slowly and gradually over a second period. For instance, the processor 12 changes the gain by approximately $\frac{1}{15}$ dB at 100 msec intervals. For instance, if a volume difference between the gain and the target value is 1 dB, the second period will be set to 1500 msec. If a volume difference between the gain and the target value is 2 dB, the second period will be set to 3000 msec. Therefore, the processor 12 makes it difficult for a user to notice the volume change. Note that, an interval (update interval) for changing the gain is set to a value sufficiently shorter than time required for change per 1 dB. For instance, if the time required for change per 1 dB is 1500 msec, the update interval will be set to 100 msec. Thus, the processor 12 gradually changes the gain without causing a user to notice the volume change. Note that, if immediate volume change is required, the processor 12 will not be necessary to change the gain gradually over the second period. For instance, the processor 12 may change the target value over a period of 500 msec.

(3) The processor 12 sets a target value based on first average powers, which have been calculated in the past, and the latest first average power. Thus, the processor 12 slowly changes a sound volume of content, depending on a level change of ambient environmental sounds. Therefore, the processor 12 is avoided from giving sense of incongruity to a user.

(4) The processor 12 sets a reference level based on first average powers calculated at the time of user's volume operation. When a user performs a volume operation, a volume balance between ambient environmental sounds and the sound of content is in a good state for a user. By setting the reference level based on the first average powers calculated at the time of user's volume operation, the processor 12 can perform volume control on the basis of the state where the volume balance is comfortable to a user.

(5) The processor 12 multiplies a difference between the past average power and the latest average power by a predetermined change ratio (e.g., $\frac{1}{4}$ to $\frac{1}{12}$) to reduce the target value. Thus, the volume change is suppressed, thereby further reducing a possibility of causing user's uncomfortable feeling.

(6) The processor 12 sets a lower limit and an upper limit of the target value. For instance, the processor 12 sets the upper limit and the lower limit of the target value to +3 dB. Thus, the processor 12 prevents a user from noticing the volume change. Further, the processor 12 may set the upper limit of the target value to a value (e.g., +1.5 dB) smaller than the lower limit. Thus, a rising amount of volume is suppressed, thereby giving priority to hearing protection.

Figure 4:
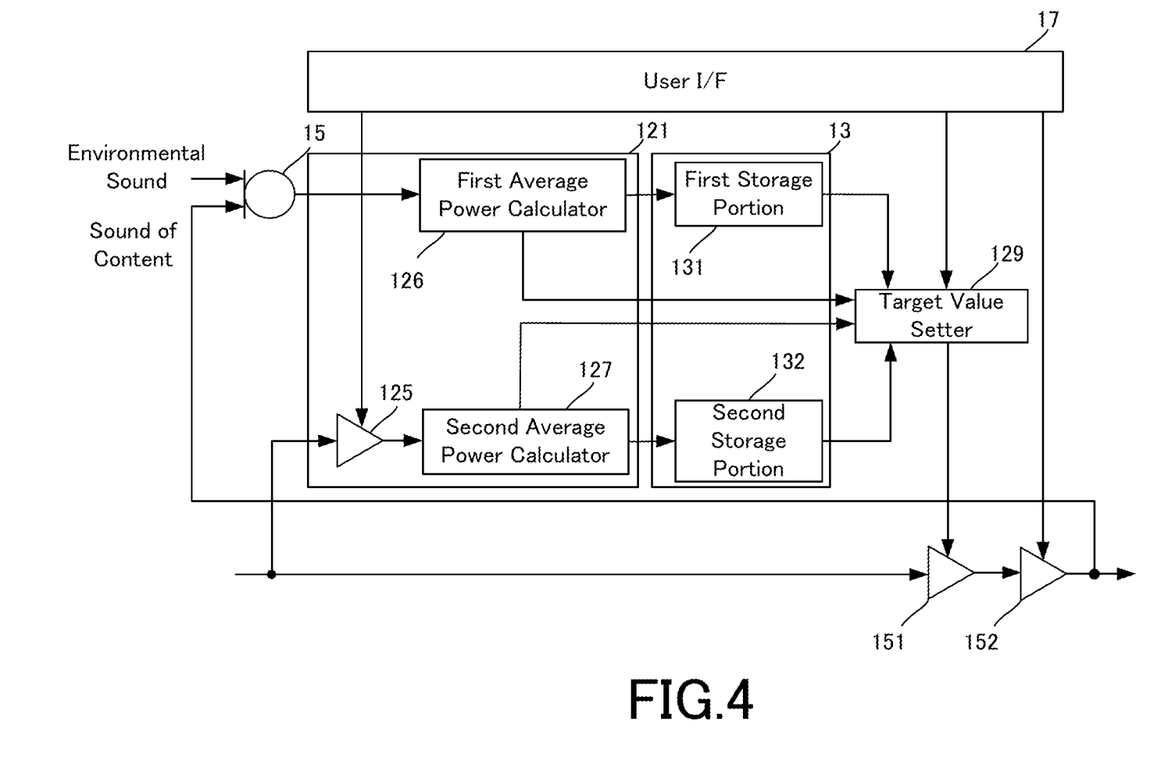
FIG. 4 is a block diagram showing a functional configuration of a headphone 12 in accordance with a modification.

Next, FIG. 4 is a block diagram showing a functional configuration of a processor 12 in accordance with a modification. The same reference numerals are assigned to the same configurations as in FIG. 2, and the description thereof is omitted. A microphone 15 in accordance with a modification captures a composite signal in which the sound signal of content, which is subjected to level adjustment in the third level adjuster 152, is added to a sound signal in accordance with an environmental sound. In other words, the sound (composite signal) captured by the microphone 15 in this modification includes the sound of content and an environmental sound. Herein, the sound of content is a sound that is outputted from the speaker unit 16, passes through a case of the headphone 1, a user's body (ear), a space, and the like, and is fed back. The microphone 15 outputs the composite signal to the first average power calculator 126.

The first average power calculator 126 calculates an average power (third average power) of the composite signal during 1000 msec, for example. The first storage portion 131 stores the third average power. The first storage portion 131 stores the third average powers calculated a plurality of times (e.g., four times), which contain the latest third average power.

The target value setter 129 sets a target value based on a ratio of the third average power to the second average power. Specifically, the target value setter 129 divides the third average power by the second average power. In the target value setter 129, the value obtained by dividing the third average power by the second average power is set as an evaluation value. The target value setter 129 subtracts a reference level from the evaluation value to set the target value.

In the modification, however, the reference level is calculated based on a ratio of an average of the past third average powers to an average of the past second average power. The target value setter 129 obtains the third average powers at four times, which are stored in the first storage portion 131, and the second average powers at a plurality of times (e.g., four times), which are stored in the second storage portion 132. The target value setter 129 calculates an average of the second average powers at four times and an average of the third average powers at a plurality of times (e.g., four times). The target value setter 129 divides the average of the third average powers at a plurality of times (e.g., four times) by the average of the second average powers at a plurality of times (e.g., four times). The target value setter 129 set the divided value as the reference level.

The target value setter 129 subtracts the reference level from the evaluation value to set the target value. If the subtracted value is a negative value, the target value will also be a negative value, and if the subtracted value is a positive value, the target value will also be a positive value. If the target value is a negative value, the target value setter will perform control so as to decrease the sound volume. If the target value is a positive value, the target value setter 129 will perform control so as increase the sound volume.

However, if an absolute value of the subtracted value is less than or equal to a predetermined threshold, the target value setter 129 will set the target value to zero. When the absolute value of the subtracted value exceeds the predetermined threshold, the target value setter 129 sets the subtracted value as the target value. Thus, an influence of errors, which depend on a correlation component between an ambient environmental sound and the sound of content, can be reduced by the target value setter 129.

Further, the target value setter 129 may round off the target value by 0.5 dB. Furthermore, the target value setter 129 may set a lower limit or an upper limit of the target value. For instance, the target value setter 129 may set the upper limit of the target value to +3 dB, or may set the lower limit of the target value to −3 dB. Note that, when the absolute value of the subtracted value exceeds the predetermined threshold, the target value setter 129 may set the upper limit or the lower limit as the target value.

Further, the target value setter 129 may change the upper limit or the lower limit of the target value according to a volume of the sound signal of content. For instance, in the target value setter 129, the upper limit of the target value is made variable between 0 dB and +3 dB, and the lower limit of the target value is made variable between −3 dB and 0 dB. The manner for changing the upper limit and the lower limit, which is the same as the above-mentioned one, is based on a difference between an average of the second average powers at four times and an upper limit (e.g., −20 dB) or a lower limit (e.g., −50 dB) of volume.

The processor 12 in accordance with the modification sets the target value based on a ratio between the sound of content and a composite sound containing the sound of content and an ambient environmental sound. In an ear-wearing device such as a headphone, a sound outputted from the speaker unit 16 is collected by the microphone 15. Thus, a loop gain is likely to occur. In this case, the target value is likely to be changed depending on the loop gain. The loop gain, however, varies depending on wearing conditions of a headphone. Thus, the measurement thereof is made difficult. On the other hand, the processor 12 in accordance with the modification sets the target value based on a ratio between the sound of content and a composite sound containing the sound of content and an ambient environmental sound, thereby making it possible to reduce an influence of the loop gain.

Further, in the processor 12 in accordance with the modification, the target value is also changed according to volume change of content. For instance, when the sound volume of content becomes very large, the target value has a negative value. As a result, control is performed so as to suppress the sound volume. Thus, the processor 12 in accordance with the modification will perform control so as to give more priority to hearing protection.

Note that, it is preferred that the processor 12 in accordance with the modification does not control the sound volume without setting the target value, until the second average power (i.e., sound volume of content) becomes more than or equal to a predetermined value. For instance, after reproduction of content is started, a silent period is included for a while. Thus, the second average power (sound volume of content) is lowered. It is assumed that the target value is set when the second average power is too low. In this case, the sound volume is likely to be increased even when a level of ambient environmental sounds is low. Accordingly, it is preferred that the processor 12 does not control the sound volume without setting the target value, until the second average power (i.e., volume of content) becomes more than or equal to a predetermined value.

Further, in the processor 12 in accordance with the modification, it is preferred that a period for calculating an average power is set to have a certain amount of time (e.g., 1000 msec to 5000 msec). In the processor 12 in accordance with the modification, the target value is also changed depending on the sound volume of content. It is assumed that, under a situation that the sound volume of content is changed so frequently, if the period for calculating an average power is short, the target value will also be changed frequently. Therefore, in the processor 12 in accordance with the modification, it is preferred that the period for calculating an average power is set to have a certain amount of time (e.g., 1000 msec to 5000 msec).

Note that, in the above-mentioned embodiment, the processor 12 calculates an average power during the first period (1000 msec) at an interval of the first period (e.g., 1000 msec intervals). In other words, periods for calculating average powers are not overlapped with each other. However, the processor 12 may calculate an average power during the first period (1000 msec) at an interval of the third period (e.g., 100 msec intervals) shorter than the interval of the first period, for example. In this case, periods for calculating average powers are overlapped with each other. Thus, followability of volume change is improved. Further, the processor 12 may calculate an average power during 5000 msec at 1000 msec intervals, for example.

The description of the present embodiments is illustrative in all respects and is not to be construed restrictively. The scope of the present invention is indicated by the appended claims rather than by the above-mentioned embodiments. Furthermore, the scope of the present invention includes the scope of the claims and a range equivalent thereto.

What is claimed is:

1. A headphone volume control method comprising:
   receiving a first sound signal captured by a microphone;
   receiving a second sound signal of content;
   adjusting a sound volume of the second sound signal;
   calculating a first level of a composite signal composing the first sound signal and the adjusted second sound signal during a first period;
   calculating a second level of the received second sound signal during the first period;
   receiving a volume operation from a user;
   setting a reference level based on the first level and the second level, upon receiving the volume operation;
   determining a target value of the sound volume based on the reference level and a level ratio of the first level to the second level; and
   changing a reproduction volume of the content to be reproduced to the target value gradually over a second period.

2. The headphone volume control method according to claim 1, further comprising:
   storing the first and second levels as past values, wherein the setting sets the reference level further based on the past values, and the determining determines the target value based on both the reference level and latest calculated first and second levels.

3. The headphone volume control method according to claim 1, wherein the changing of the reproduction volume changes the reproduction volume to the target value based on a present reproduction volume.

4. The headphone volume control method according to claim 1, wherein the calculating calculates the first level from an average power of the first sound signal captured by the microphone.

5. The headphone volume control method according to claim 1, further comprising setting an upper limit or a lower limit of the target value.

6. The headphone volume control method according to claim 5, wherein:
the upper limit is set to +3 dB relative to a present reproduction volume, and
the lower limit is set to −3 dB relative to the present reproduction volume.

7. The headphone volume control method according to claim 1, the changing of the reproduction volume changes the reproduction volume so that time required to change per 1 dB is set to more than or equal to 1500 msec.

8. A headphone comprising:
a microphone;
a user interface that receives a volume operation from a user; and
at least one processor that implements instructions stored in a memory and executes a plurality of tasks, including:
a sound receiving task that receives a first sound signal captured by the microphone;
a sound receiving task that receives a second sound signal of content;
a sound adjusting task that adjusts a sound volume of the second sound signal;
a level calculating task that calculates a first level of a composite signal composing the first sound signal and the adjusted second sound signal during a first period;
a level calculating task that calculates a second level of the received second sound signal during the first period;
a reference setting task that sets a reference level based on the first level and the second level upon receiving the volume operation;
a target value setting task that determines a target value of the sound volume based on the reference level and a level ratio of the first level to the second level; and
a level adjusting task that changes a reproduction volume of the content to be reproduced to the target value gradually over a second period.

9. The headphone according to claim 8, further comprising:
a storage device,
wherein the plurality of tasks include storing task that stores, in the storage device, the first and second levels as past values, and
wherein the reference setting task sets the reference level further based on the past value, and the target value setting task determines the target value based on both the reference level and latest calculated first and second levels.

10. The headphone according to claim 8, wherein the level adjusting task changes the reproduction volume to the target value based on a present reproduction volume.

11. The headphone according to claim 8, wherein the level calculating task calculates the first level from an average power of the first sound signal captured by the microphone.

12. The headphone according to claim 8, wherein the plurality of tasks include a limit setting task that sets an upper limit or a lower limit of the target value.

13. The headphone according to claim 12, wherein:
the upper limit is set to +3 dB relative to a present reproduction volume, and
the lower limit is set to −3 dB relative to the present reproduction volume.

14. The headphone according to claim 8, wherein the level adjusting task changes the reproduction volume so that time required to change per 1 dB is set to more than or equal to 1500 msec.

* * * * *